(12) United States Patent
Koyakutty et al.

(10) Patent No.: US 8,721,926 B2
(45) Date of Patent: May 13, 2014

(54) SINGLE-SOURCE PRECURSOR FOR SEMICONDUCTOR NANOCRYSTALS

(75) Inventors: Manzoor Koyakutty, Rajasthan (IN); Aditya Verma, Rajasthan (IN); Sampat Raj Vedera, Rajasthan (IN); Narendra Kumar, Rajasthan (IN); Thundyil Raman Narayana Kutty, Rajasthan (IN)

(73) Assignee: The Director General Defence Research & Development Organisation, New Delhi (IN)

( * ) Notice: Subject to any disclaimer, the term of this patent is extended or adjusted under 35 U.S.C. 154(b) by 42 days.

(21) Appl. No.: 13/617,843

(22) Filed: Sep. 14, 2012

(65) Prior Publication Data
US 2013/0082216 A1    Apr. 4, 2013

Related U.S. Application Data

(62) Division of application No. 12/088,590, filed as application No. PCT/IN2006/000214 on Jun. 27, 2006, now Pat. No. 8,287,951.

(30) Foreign Application Priority Data

Sep. 29, 2005 (IN) .......................... 2612/DEL/2005

(51) Int. Cl.
    *C09K 11/54* (2006.01)
    *C09K 11/56* (2006.01)

(52) U.S. Cl.
    USPC ....... 252/301.4 S; 252/301.4 R; 252/301.6 S; 252/301.6 R; 252/519.51; 977/813; 977/825

(58) Field of Classification Search
    USPC ....... 252/301.4 R, 301.4 S, 301.6 R, 301.6 S; 977/813, 825
    See application file for complete search history.

(56) References Cited

U.S. PATENT DOCUMENTS

| | | | |
|---|---|---|---|
| 5,525,377 | A | 6/1996 | Gallagher et al. |
| 6,322,901 | B1 | 11/2001 | Bawendi et al. |
| 6,423,551 | B1 | 7/2002 | Weiss et al. |
| 7,767,260 | B2 | 8/2010 | Peng et al. |
| 2002/0011564 | A1 | 1/2002 | Norris |
| 2002/0071952 | A1 | 6/2002 | Bawendi et al. |
| 2007/0194279 | A1 | 8/2007 | Peng et al. |

FOREIGN PATENT DOCUMENTS

DE    10111909 A1    9/2002

OTHER PUBLICATIONS

Synthesis and photoluminescence characteristics of doped ZnS nanoparticles, Yang et al, Applied Physics, 73, 2001, 455-458.*
Artemyev et al., "Luminescence of CdS Nanoparticles Doped with Mn", Phys. Stat. Sol. 2001, pp. 191-194, 224, No. 1.
Bhargava et al., "Optical Properties of Manganese-Doped Nanocrystals of ZnS", Physical Review Letters, Jan. 17, 1994, pp. 416-419, vol. 72, No. 3.
Corrado et al. "Synthesis, Structural, and Optical Properties of Stable ZnS:Cu,Cl Nanocrystals", J. Phys. Chem. 2009, 113, pp. 3830-3839.
Counio et al., "CdS: Mn Nanocrystals in Transparent Xerogel Matrices: Synthesis and Luminescence Properties", J. Phys. Chem., 1996, pp. 20021-20026, 100.
Derfus et al., "Probing the Cytotoxicity of Semiconductor Quantum Dots", Nano Letters, 2004, pp. 11-18. vol. 4, No. 1.
Guo et al., "Highly monodisperse polymer-capped ZnO nanoparticles: Preparation and optical properties", Applied Physics Letters, May 15, 2000, pp. 2901-2903, vol. 76, No. 20.
Isobe et al., "Enhanced Photoluminescence for ZnS Nanocrystals Doped with Mn2+ close to Carboxyl Groups and/or S2-Vacancies", Mat. Res. Soc. Symp. Proc., 1999, pp. 383-387, vol. 536.
Khosavri et al., "Green luminescence from copper doped zinc sulphide quantum particles", Applied Physics Letters, Oct. 30, 1995., pp. 2702-2704, 67 (18).
Manzoor et al. "Synthesis and photoluminescent properties of ZnS nanocrystals doped with copper and halogen", Materials Chemistry and Physics, 2003, 82. pp. 718-725.
Mikulec et al., "Organometallic Synthesis and Spectroscopic Characterization of Manganese-Doped CdSe Nanocrystals". J. Am. Chem. Soc., 2000, pp. 2532-2540, 122.
Suyver et al., "Synthesis and Photoluminescence of Nanocrystalline ZnS:Mn2+", Nano Letters, 2001, pp. 429-433, vol. 1, No. 8.
Wang et al. "Synthesis and optical properties of ZnS:Cu(II) nanoparticles". Solid State Communications 2000, pp. 493-496, 115.
Warheit, "Nanoparticles: health impacts?", Materialstoday, Feb. 2004, pp. 32-35.

* cited by examiner

*Primary Examiner* — Mark Kopec
*Assistant Examiner* — Haidung Nguyen
(74) *Attorney, Agent, or Firm* — The Webb Law Firm (57) ABSTRACT

A single-source solid precursor matrix for semiconductor nanocrystals includes 45-55% by weight of zinc, 28-35% by weight of oxygen, 0.70-1.2% by weight of carbon, 1.5-2.5% by weight of hydrogen, 4-6% by weight of nitrogen, 5-7% by weight of sulphur and 1-5% by weight of dopant ions with respect to the weight of zinc atoms. Doped semiconductor nanocrystals for multicolor displays and bio markers include 60-65% by weight of zinc, 30-32% by weight of sulphur, 1.2-1.3% by weight of copper and 1.2-1.3% by weight of dopant ions.

4 Claims, 8 Drawing Sheets

SINGLE-SOURCE PRECURSOR FOR SEMICONDUCTOR NANOCRYSTALS

CROSS REFERENCE TO RELATED APPLICATION

This application is a divisional of U.S. patent application Ser. No. 12/088,590, filed Aug. 27, 2008, now U.S. Pat. No. 8,287,951, which claims priority to International Application No. PCT/IN2006/000214, filed on Jun. 27, 2006, which claims priority to India Patent Application No. 2612/DEL/2005, filed on Sep. 29, 2005, all of which are incorporated by reference herein.

BACKGROUND OF THE INVENTION

1. Field of Invention

This invention is related to a single source solid precursor matrix for producing semiconductor nanocrystals and doped semiconductor nano crystals for displays and a process for preparation thereof. The doped semiconductor nanocrystals of II-VI compounds generated in situ within an inorganic layered precursor (LP) and particularly doped ZnS nanocrystals surface capped with ZnO micro-shell, both generated and remain embedded within the decomposed zinc-thiourea-sulfato-hydroxide precursor matrix. The composite material shows efficient photo- and electro-luminescence suitable for making multicolor displays and bio-markers.

2. Description of Related Art

The luminescent semiconductor nanocrystals, generally termed as nanophosphors, are employed as the materials for displays, bio-labels, and lighting applications [Bhargava R N and Gallagher D, "Optical properties of Mn doped nanocrystals of ZnS", Phys, Rev. Lett. Vol. 72, 416 (1994)]. The specific advantages of nanophosphors include the possibility of simultaneous synthesis and doping of the nanocrystals through low-temperature (room-temperature) wet chemical methods with high luminescence quantum efficiency, short radiative decay-time, wide emission color tunability, etc.

Although, the process for making nanophosphors are still evolving, however, the most known synthesis processes include reverse micelle route, synthesis of organometallics and colliodal precipitation therefrom, sol-gel process, etc. In the reverse micelle route [(Counio G, Esnouf S, Gacoin T, Boilot J P, "CdS: Mn nanocrystals in transparent Xerogel Matrices; Synthesis and Luminescence Properties", J. Phys. Chem. Vol. 100, 20021 (1996)], variety of nanoparticles including CdS, CdSe, ZnS, PbS, etc, are prepared in a size restricted water-pool of the water-in-oil ternary system. Though the method was widely used in the early stages for making intrinsic II-VI group nanoparticles, but it was found not suitable for making doped nanoparticles because of the unavoidable use of excess surfactant medium which hinder the doping process. The excess surfactant also causes difficulties in the separation of nanoparticles from the reaction medium for any technological applications. Yet another disadvantage of this process is that the surface capping agents used such as mercaptoacetic acid, mercaptoethanol, etc (thiol compounds, in general) are toxic in nature. The process also suffers from low-yield of the precipitate.

Preparation of ZnS:Mn, ZnSe:Mn and CdSe:Mn nanoparticles by the reaction involving organometallics are reported in a number of patents and publications [(U.S. Pat. No. 5,525, 377 by Ghallagher et al, US patent application no. 2002/0011564 A1 by D. J. Norris and the reports from Bhargava et al Bhargava R N and Gallagher D, "Optical properties of Mn doped nanocrystals of ZnS", Phys, Rev. Lett. Vol. 72, 416 (1994), and Mikulec F V, Kuno M, Bennani M, Hall D A, Griffin R G, Bawendi M G, "Organometallic synthesis and characterization of manganese-doped CdSe Nanocrystals", J. Am. Chem. Soc., Vol. 122, 2532, (2000), Suyver J F, Wuister S F, Kelly J J and Meijerink A, "Luminescence of nanocrystalline ZnSe:Mn" Nano Lett. Vol. 1, 429 (2000)]. Many nanoparticle systems prepared through this method are already available in the market for its use as bio-labels and medical imaging phosphors. However, this method has only limited acceptability because of the use of costlier and often poisonous organometallic chemicals. Moreover, these chemicals are rarely available or have to be freshly prepared in-house through highly controlled and stringent chemical reactions (U.S. Pat. No. 5,525,377). This results in the high cost of the products (Approx. US$500 per 10 mL of the suspension: Ref: Ocean Optics, USA, Catalog-2005). Another disadvantage of this method is the use of toxic hydrogen sulfide ($H_2S$) gas (in case of sulfide nanocrystals) as the source of $S^{2-}$-ions. A further disadvantage of this process is that the organometallic precursors of dopants such as $Mn^{2+}$, (diethyl manganese) are highly unstable and either polymerize or precipitate as separate phase during the co-precipitation reactions. Yet another disadvantage of this method is that the known art does not provide a common reaction route for the incorporation of multiple dopant ions in the semiconductor lattice, which is necessarily required for multicolor-emission from the nanophosphors. The process is also time consuming as the dissolution of the surfactants or capping polymer (e.g. PMMA) in organic solvent (toluene) takes about 12-18 hours. Further, this process necessitates an additional step of post-synthesis UV curing of the nanoparticles.

Another known preparation of nanoparticles include sol-gel synthesis and colloidal precipitation in hydrocarbon or aqueous solvents under various environmental conditions. Artemyev M V, Gurinovich L I, Stupak A. P and Gaponenko V, "Luminescence of CdS nanoparticles doped with Mn" Phys. Stat. Sol (b) Vol. 224, 191 (2001), Ali Azam Khosravi, Kundu M, Jatwa L, Deshpande S K, Bhagawat U A, Murali Shastri, Kulkarni S. K, "Green luminescence from copper doped zinc sulphide quantum particles", Appl. Phys. Lett. Vol. 67, 2702 (1995) and Wang M, Sun L, Fu X, Liao C and Yan C, "Synthesis and optical properties of ZnS:Cu (II) nanoparticles", Solid State Commun. Vo. 115, 493 (2000) discuss the preparation of CdS:$Mn^{2+}$ (in DMF and 1-mercaptopropyltrietoxysilane gel), ZnS:$Mn^{2+}$ (inert atmosphere with mercaptoethanol capping), ZnS:$Cu^{2+}$ (in glycine aqueous solution), respectively. Although these methods are adequate for the preparation of nanosized particles, however, they do not represent a convenient and generalized methodology for doping of different impurity ions having various valence states. The methods also suffer from the disadvantage of immediate surface oxidation of nanoparticles which invites the requirement of inert atmosphere for the preparation.

A major disadvantage for the nanoparticles systems prepared by all the aforesaid known processes is that they are highly dispersible in air and water and therefore cause potential environmental threats. Recent toxicological studies (David B. Warheit; 'Nanoparticles: Health Impacts' Materials Today, February 2004) show that the nanoparticles inhaled during the synthesis, processing and/or applications produce highly adverse inflammatory responses when compared to bigger particles of the same chemical composition. The inhaled nanoparticles deposit in the lung's wall and slowly escape the lung's defense (alveolar macrophage) surveillance system and transmigrate into the interstitial regions of the lung, causing long standing respiratory tract diseases including tumor. This problem is applicable to all kinds of nanoparticles and particularly more severe in the case of nanoparticles of highly toxic character, such as CdS, CdSe, PbS, etc. Recent studies of in vivo cytotoxicity of CdSe containing colloidal nanoparticles (both bare as well as core-shell) (Austin M Derfus, W. C. W Chan and Sangeeta N. Bhatia, "Probing the cytotoxicity of semiconductor quantum dots", Nano Lett. Vol. 4, 11 (2004) confirms the acute toxicity of these nanocrystals due to the release of free $Cd^{2+}$ and $Se^{2+}$ by way of disintegration of nanoparticles within the biological cells causing carcinogenic mutations. These findings reveal the main limitation of presently available luminescent nanoparticles.

Many environmentalist groups have already called by implementing moratorium or ban on the research and development of toxic nanoparticles.

Thus, the existing methods and materials related to luminescent nanoparticles are attended with disadvantages and drawbacks described hereinabove.

OBJECTS OF THE INVENTION

The main objective of the present invention is to provide doped semiconductor nanocrystals and a process for preparing environmentally safe functionalized (doped) semiconductor nanocrystals of II-VI group semiconductors surface capped with inorganic micro-shells and particularly of ZnS nanocrystals doped with $Cu^+$, $Mn^{2+}$, $Al^{3+}$ or halogens (F, Cl, Br and I), surface capped with ZnO micro-shells and embedded in situ within the solid micro-structure generated by a layered-precursor (LP), through a simple method.

Another objective of the present invention is to provide doped semiconductor nanocrystals which are applicable in various types of displays and inorganic bio-labels.

Yet another objective of the present invention is to provide a process for preparing a solid precursor material and the material thereof containing all of the chemical ingredients required for the simultaneous synthesis, doping and inorganic surface capping of doped semiconductor nanocrystals.

Still another objective of the present invention is to provide a process for preparation of solid precursor and a precursor thereof wherein the solid precursor can be stored for extended periods such as a few months and used for the preparation of doped nanocrystals, by decomposing the same either in an aqueous or non-aqueous medium.

A further objective of the present invention is to provide a process for making doped ZnS nanocrystals and nanocrystals thereof which are generated in situ and remain embedded within the layered microstructure of a thiourea complex of zinc-sulfate (halide)-hydroxide, which prevents the nanocrystals from dispersing into the environment (air and water) and thereby avoids the environmental pollution caused by nanoparticles and also protects the embedded nanocrystals from reacting with its surroundings and avoids compositional and functional degradation.

Still another objective of the present invention is to provide a process for making doped ZnS nanocrystals and nanocrystals thereof which are surface capped with an inorganic shell of microcrystalline inorganic semiconductor oxide such as ZnO leading to the formation of a new nano-core/micro-shell structure wherein the ZnO shell effectively passivates the non-radiative pathways at the nanoparticles surface and thereby enhances the luminescence quantum efficiency of the core.

A further objective of the present invention is to provide a process for making doped ZnS nanocrystals and nanocrystals thereof whose emission color can be tuned over a wide range from blue (~470 nm) to red (~618 nm), without changing the original chemical composition of the solid-precursor including dopant ions only by modifying the final composition of the nano-core/micro-shell structure by controlled thermal decomposition of the initial precursor.

Yet another objective of the present invention is to provide a process for making environment-friendly doped nanocrystals and nanocrystals thereof which show bright photoluminescence, tunable over a wide range (480-618 nm) by changing a single process parameter, viz. temperature.

Yet another objective of the present invention is to provide a process for making environment-friendly nanocrystals and nanocrystals thereof which show bright alternate current (ac) electroluminescence and cathodoluminescence suitable for different display applications.

Yet another objective of the present invention is to provide a process for making luminescent nanocrystals and nanocrystals thereof which contain no toxic or carcinogenic elements and therefore suitable for both in vitro and in vivo biological applications such as bio-tagging, medical imaging, etc.

SUMMARY OF INVENTION

According to this invention there is provided a process for preparing a single source solid precursor matrix for semiconductor nanocrystals comprising the steps of:

a) Mixing of 0.1-1 Molar aqueous or non-aqueous (organic) solution containing the first component of the host matrix with 0.001-0.01 Molar aqueous/non-aqueous solution containing the first dopant ions, which needs in situ modification of valency state, b) dissolving 10-12 milligram inorganic salt for the in situ reduction of the first dopant ion in the solution, c) addition of 0.001-0.01 Molar aqueous/non-aqueous solution of an inorganic salt containing the dopant ions which do not need modifications of their valency state, d) addition of 0.1-1 Molar aqueous/non-aqueous solution of an inorganic salt containing the second component of the host material, e) addition of 5-10% by wt. of an aqueous solution containing a pH modifying complexing agent, to obtain a mixture, f) heating the mixture thus obtained in step (e) to obtain a solid layered micro-structural precursor compound.

Further according to this invention there is provided a process for preparation of a doped semiconductor nanocrystals for multicolor displays and bio markers comprising steps of:

a) Mixing of 0.1-1M aqueous or non-aqueous (organic) solution containing the first component of the host matrix with 0.001-0.01 Molar of aqueous/non-aqueous solution containing the first dopant ions, which needs in situ modification of valency state, b) dissolving 10-20 milligram of an inorganic salt for the in situ reduction of the first dopant ion in the solution, c) addition of 0.001-0.01 Molar aqueous/non-aqueous solution of an inorganic salt containing the dopant ions which do not need modifications of their valency state, d) addition of 0.1-1 Molar aqueous/non-aqueous solution of an inorganic salt containing the second component of the host material, e) addition of 5-10% by wt. of an aqueous solution containing a pH modifying complexing agent, to obtain a mixture, f) heating the mixture thus obtained in step (e) to obtain a solid layered micro-structural precursor compound, g) heating of the compound in solid form or in solution medium to obtain semiconductor nanocrystals.

Yet further according to this invention there is provided a single source solid precursor matrix for semiconductor nanocrystals comprising of 45-55% by wt of Zinc, 28-35% by wt of Oxygen, 0.70-1.2% by wt of Carbon, 1.5-2.5% by wt of Hydrogen, 4-6% by wt of Nitrogen, 5-7% by wt of Sulphur and 1-5% by wt of dopant ions with respect to the weight of Zinc atoms.

Still further according to this invention there is provided a doped semiconductor nanocrystals for multicolor displays and bio markers comprising of 60-65% by wt of Zinc, 30-32% by wt of Sulphur, 1.2-1.3% by wt of Copper and 1.2-1.3% by wt of dopant ions.

DESCRIPTION OF THE PREFERRED EMBODIMENTS

Figure 1:
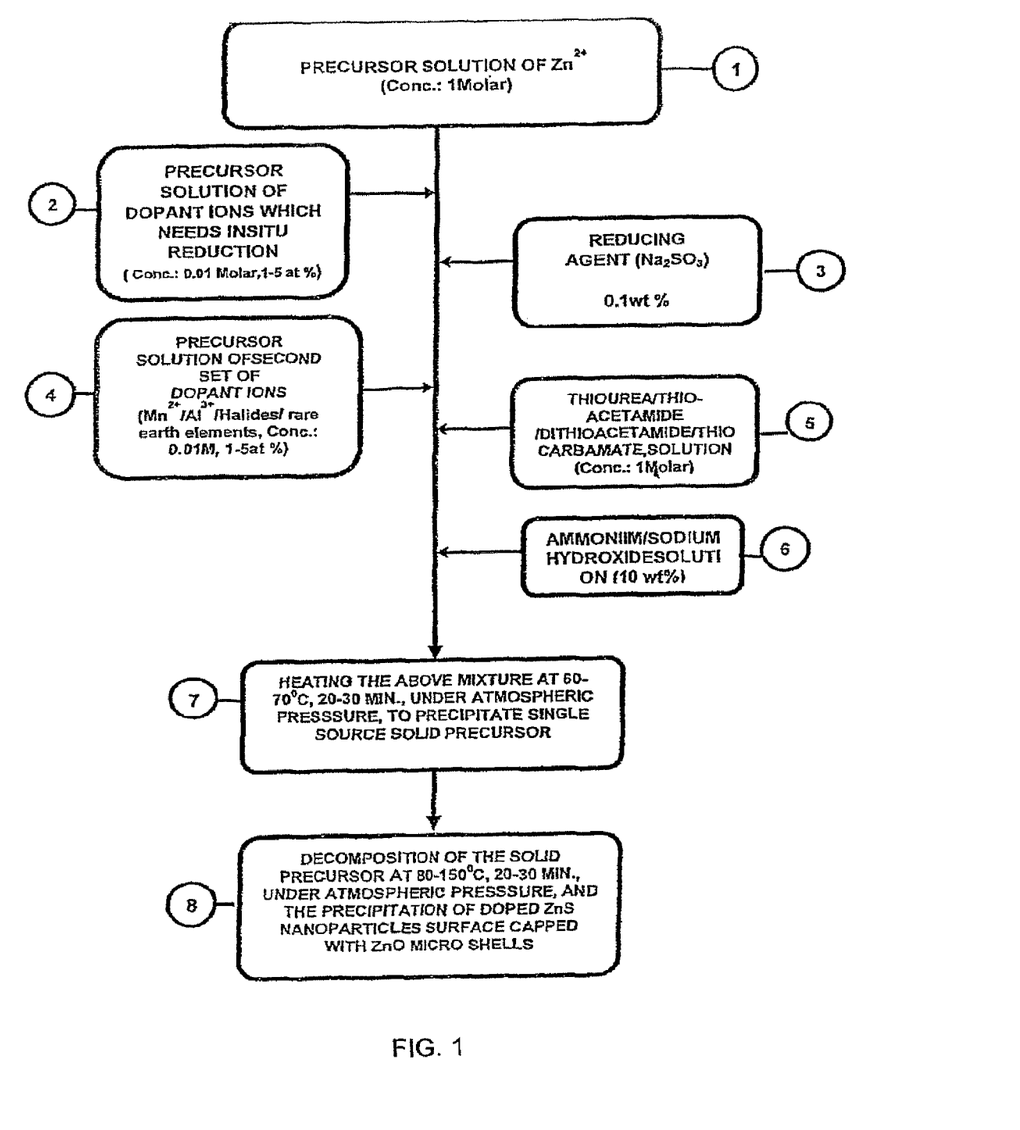
FIG. 1 shows: Flow chart for the process of making doped semiconductor nanoparticles capped with oxide microshells.

Reference may be made to FIG. 1, which presents a flow chart of the process. Molecular weight equivalent to (0.1-1 Molar) of a zinc salt such as halide, sulphate, nitrate and acetate is dissolved in 1000 ml of an aqueous or non-aqueous medium such as Dimethyl Formamide, with the boiling point ~151° C., containing the dopant ions $Cu^{2+}$ such as copper acetate ($C_4H_6CuO_4H_2O$), which needs in situ reduction. To the mixture thus obtained ~10-20 milligram of a reducing agent such as Sodium Sulphite ($Na_2SO_3$) is added for the reduction of $Cu^{2+}$ ions followed by addition of 0.001-0.01 Molar solution of second set of dopant ions $Al^{3+}$ such as aluminum nitrate [$Al(NO_3)_3.9H_2O$] or alkali halides (NaCl, KBr, etc). To this mixture of solutions, 0.001-0.01 Molar of precursor solution containing second or third of dopant ions of Manganese such as Manganese Sulphate ($MnSO_4H_2O$) may additionally be added so as to obtain orange EL emitting materials. This is followed by the supply of a source of Sulphide ion for example: thiourea, thio-acetamide, thio-semi-carba-Zide or dithiocarbonate which is 0.1-1 Molar in amount to the Zn-dopant precursor mixture, subsequently supplemented with 5-10% by weight of a pH modifier/controlling agent such as Ammonium salts to attain pH of 9-12. The temperature for the above steps is maintained at 30-40° C.

The mixture obtained above is heated at 60-70° C. for 20-30 minutes so as to obtain precipitate of a layered solid-precursor, which is white voluminous mass. This mass is either separated at this stage and stored for its future use or alternatively, decomposed in the mother liquor to precipitate Zinc Sulphide (ZnS) nanoparticles by heating at a temperature of 80-150° C. for 20-30 minutes.

The solid precursor can be decomposed by heating in its solid form or in a liquid medium of water/dimethyl formamide or alcohol.

The solid precursor or nanoparticles obtained above is subjected to the step of washing with suitable solvents such as water, acetone or ethanol followed by drying at 70 to 80° C. to get the required product for use.

The solid precursor obtained by the above process comprises 45-55% by wt of Zinc, 28-35% by wt of Oxygen, 0.70-1.2% by wt of Carbon, 1.5-2.5% by wt of Hydrogen, 4-6% by wt of Nitrogen, 5-7% by wt of Sulphur and 1-5% by wt of dopant ions such as Cu, Al, Mn, Eu, Tb, Tm, Cs, Ce with respect to the weight of Zinc atoms.

Further, the doped semiconductor nanocrystal obtained by the above process comprising of 60-65% by wt of Zinc, 30-32% by wt of Sulphur, 1.2-1.3% by wt of Copper and 1.2-1.3% by wt of dopant ions, such as Mn, Al, Eu, Tb, Tm, Cs, Ce.

Figure 2:
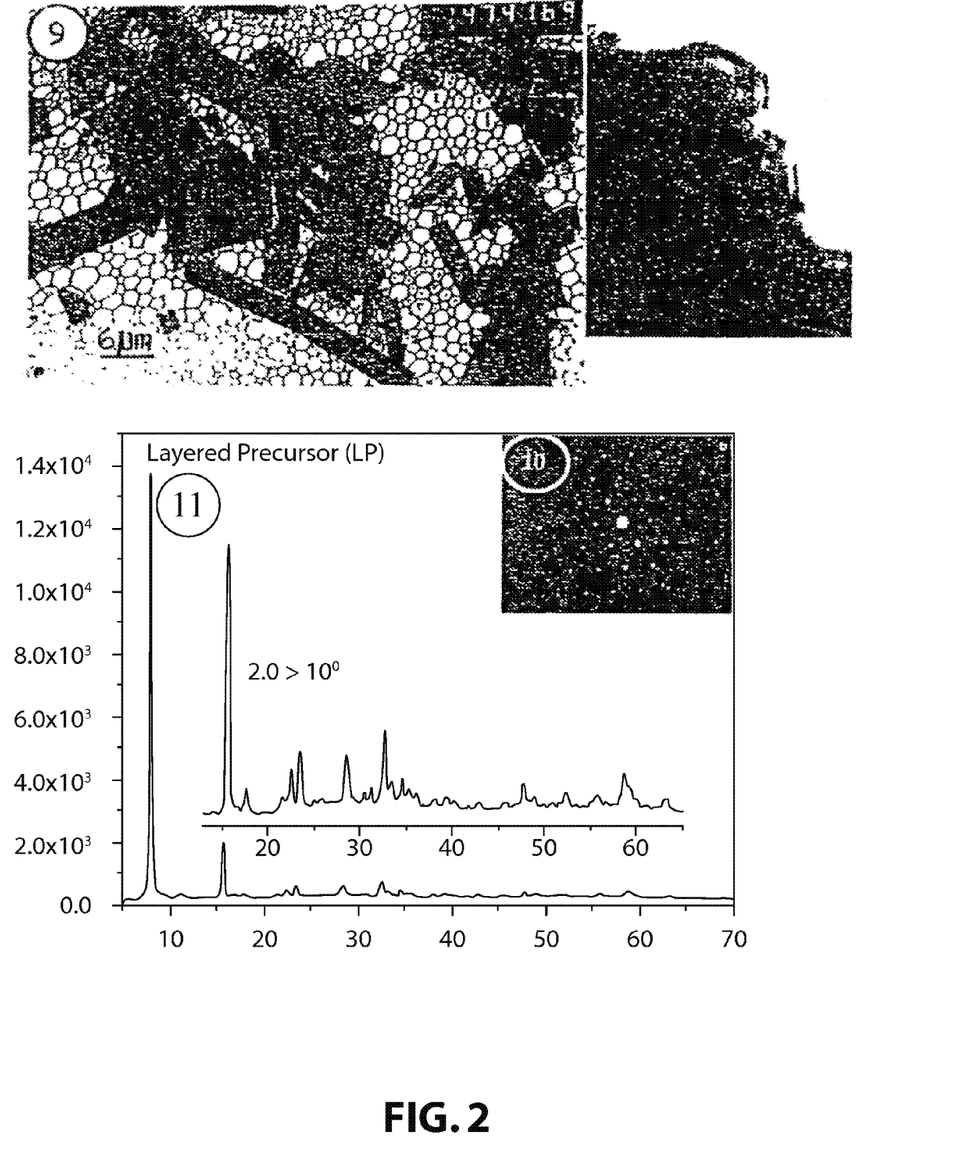
FIG. 2 shows: TEM image SAED and XRD pattern of the single-source solid precursor used for making doped nanoparticles.

An advantageous effect of the present invention is that the solid-precursor contains all the chemical ingredients required for the precipitation of highly luminescent, environmentally safe doped semiconductor nanocrystals, which is stable. This precursor can be stored for long durations, without any degradation. The TEM image of this layered-precursor compound is shown in FIG. 2 wherein the micro-crystallites comprise thin (electron transparent) as well as thick blades (electron-opaque) with lath-shaped prismatic platy morphology. The high resolution TEM image shows parallel lines of lattice planes with basal spacing ~11.3 A. The spotty ED pattern indicates single crystalline nature of the solid precursor. The X-Ray diffraction pattern shows strong basal reflection corresponding to the lattice-plane spacing (d-spacing) of ~11.3 A with multiple interlayer low-intensity reflections corresponding to d~9.13, 7.82 and 5.63 A. From the elemental analysis, the compositions of these layered-precursors precipitated under different conditions are found to be: $Zn_{12}(NH_3)(SO_4)_3(OH)_{18}.6(CSN_2H_4).2H_2O$ (prepared at low $NH_4OH$ concentration; pH ~9.5-10.0) or $Zn_{12}(NH_3)_6(SO_4)_2(S^{2-})(OH)_{18}.4(CSN_2H_4).H_2O$ (prepared at higher $NH_4OH$ concentration; pH>10.0,) or $Zn_{12}(NH_3)_6(SO_4)_2H_{16}(S^{2-})(NH_2CS-)_2.2(CSN_2H_4)_4.H_2O$ (prepared at higher $NH_4OH$ and thiourera/$Zn^{2+}$ concentration; pH>12.0). The general formula for the solid-precursor can be written as $Zn_{(x+x/2)}(SO_4)_2(OH)_y(NH_2CS)_z(NH_3)_4.nH_2O$, where x=y+z.

Figure 3:
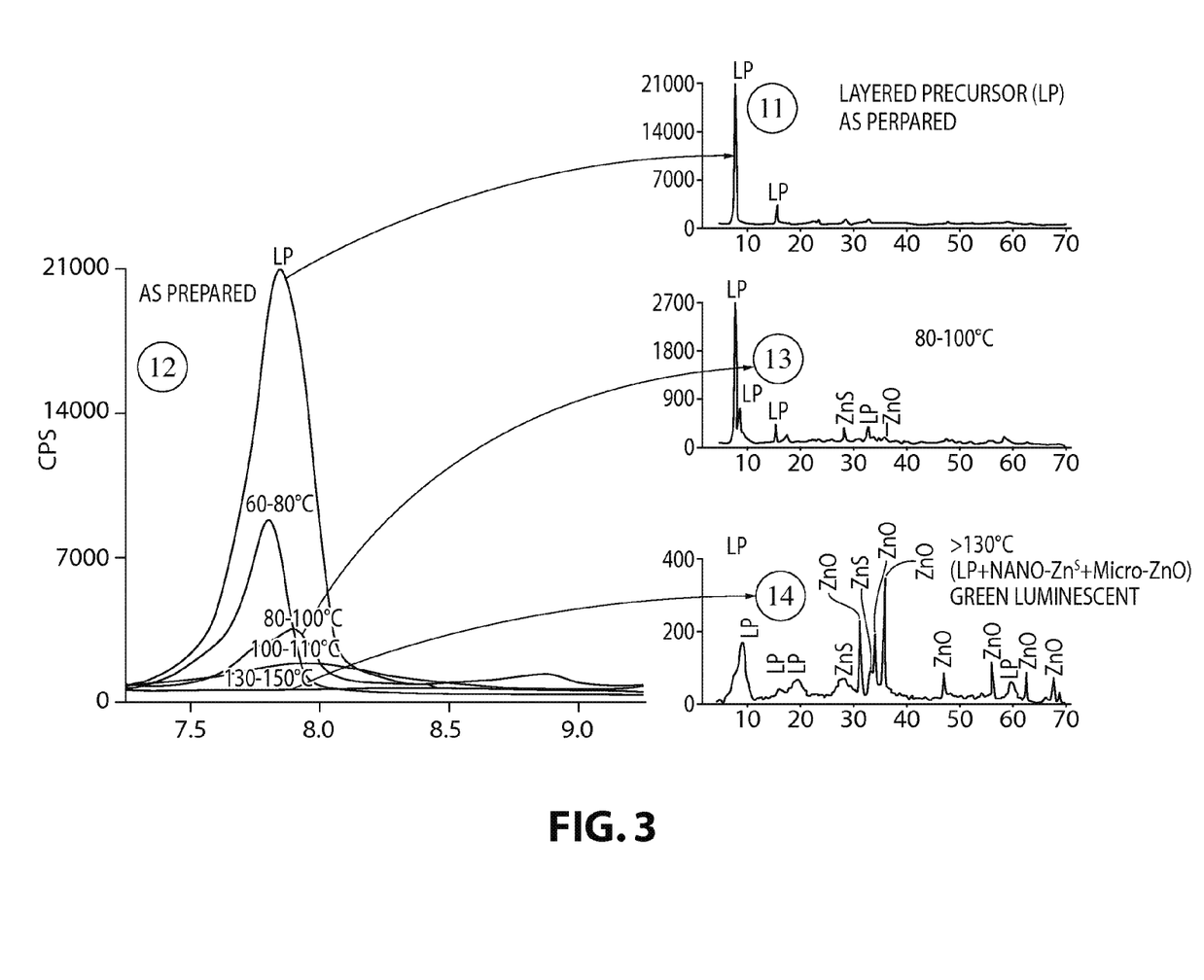
FIG. 3 shows: XRD pattern of different decomposition products of the solid precursor.

Another advantageous feature of the present invention is that the doped ZnS nanoparticles are formed within the gallery-space of the layered-precursor due to the systematic collapse of the interlayer occupants. The dopant ions are distributed throughout the precursor structure, which eventually gets incorporated into the nanoparticle-lattice. The collapse of the interlayer occupants and associated disordering in the structure is evident from the modifications in the XRD pattern as shown in FIG. 3. With the increase in the reaction temperature, the intensity of the basal reflection decreases and slightly shifted in 2θ value indicating systematic disorder in the structure. On controlled heat treatment (80-130° C.), ZnS nanoparticles are generated within the interlayer region followed by the partial surface oxidation (ZnO). The resulting composite structure comprises of the partially decomposed precursor and nano-ZnS core with ZnO micro-shell, which shows strong photoluminescence (green) indicating effective doping of impurity ions. Heating at 130-150° C. leads to nano-ZnS core covered with micro-ZnO shells, and over 150-200° C. the compound gradually oxidizes into pure ZnO.

Figure 4:
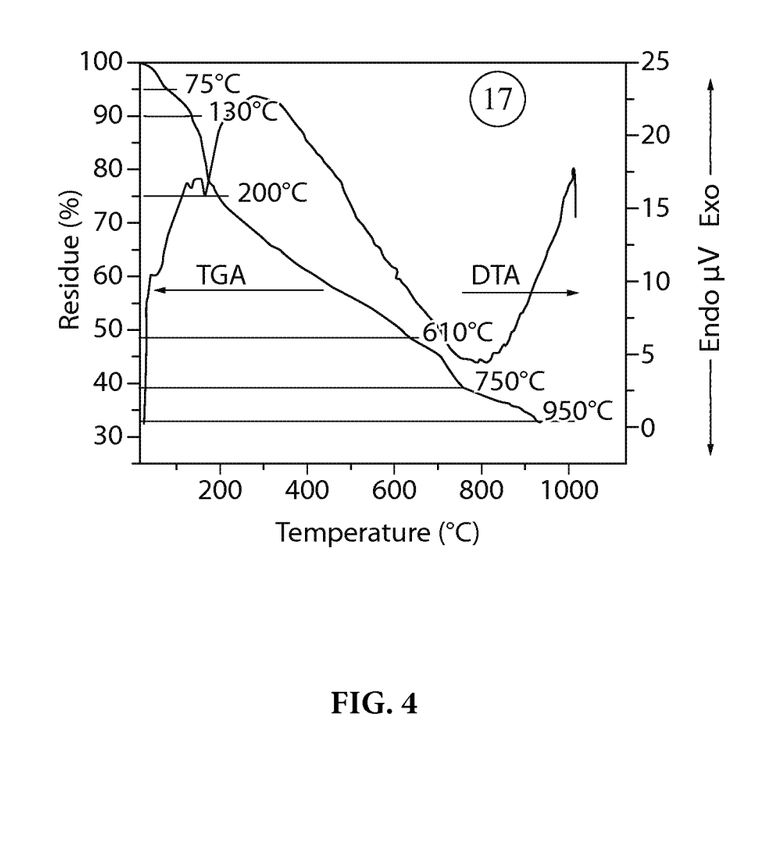
FIG. 4 shows: Thermogravimetic data, TEM image and XRD of the ZnS nanoparticles embedded within the layered matrix.

The decomposition pathways, as said above, is further evident from the thermogravimetric analysis. FIG. 4 shows a series of overlapping regions of weight loss under heat treatment in air. The first two stages of weight loss ~40-75° C. and 75-130° C., represents the collapse of the intercalated occupants and precipitation of nano-ZnS. Two minor endothermic peaks between 40-130° C. represent these chemical reactions. From 130 to 200° C., major weight loss of 25% with a strong endothermic activity ~175° C. indicated the complete collapse of the interlayer occupants, and escape of crystallized water, ammonia, $CO_2$, etc. During 200-610° C., the layered structure gets completely dehydroxylated to form more ZnO phase which encapsulates the doped ZnS nanoparticles. At 610-950° C. $SO_4$ escapes leaving only ZnO as the residue.

Another advantage of the present invention is that the nanoparticles formed are not freely-flowing particles, instead they are embedded within the partially or fully decomposed layered compound as shown in FIG. 4. Magnified region of a large thin platy crystallite of a partially decomposed product shows that ZnS nanoparticles of ~5 nm size are embedded within the micro-crystallites. The selected area ED pattern also shows the presence of sphalerite nanoparticles and the mixed XRD reflections from the layered precursor (LP), ZnS (cubic) nanoparticles and the ZnO micro-shell confirm the unique composite feature. This architecture ensures that the nanoparticles will not diffuse and contaminate the environment. Thus the invention provides a novel way of making environmentally safe but functionally potential nanoparticles.

Still another advantage of the present invention is that the functionalized nanoparticles embedded within the layered compound is in situ surface-capped with a transparent (UV-VIS) semiconductor oxide of ZnO. When the precursor is decomposed in aqueous medium under air environment, the ZnS nanoparticles are preferably formed by the predominant reaction of the gallery occupants (Thio-derivative/$S^{2-}$-source) with its 'corbel' containing Zn2+ ions at the octahedral/tetrahedral sites. Subsequently on heat treatment the ZnO shells are formed and grow into sub-micrometer thicknesses due to the decomposition of the 'corbel' of the layered precursor. The material shows maximum luminescence efficiency with the formation of ZnO shells. In the XRD pattern (FIG. 3) of efficiently luminescent samples, the presence of the sharp ZnO reflections against the broadened cubic-ZnS nanoparticle pattern, which remains unchanged in line width, clearly indicate the deduced mechanism. The ZnO caps effectively passivate the defect-related non-radiative pathways at the nanoparticle surface and thereby increase the luminescence quantum efficiency.

Figure 5:
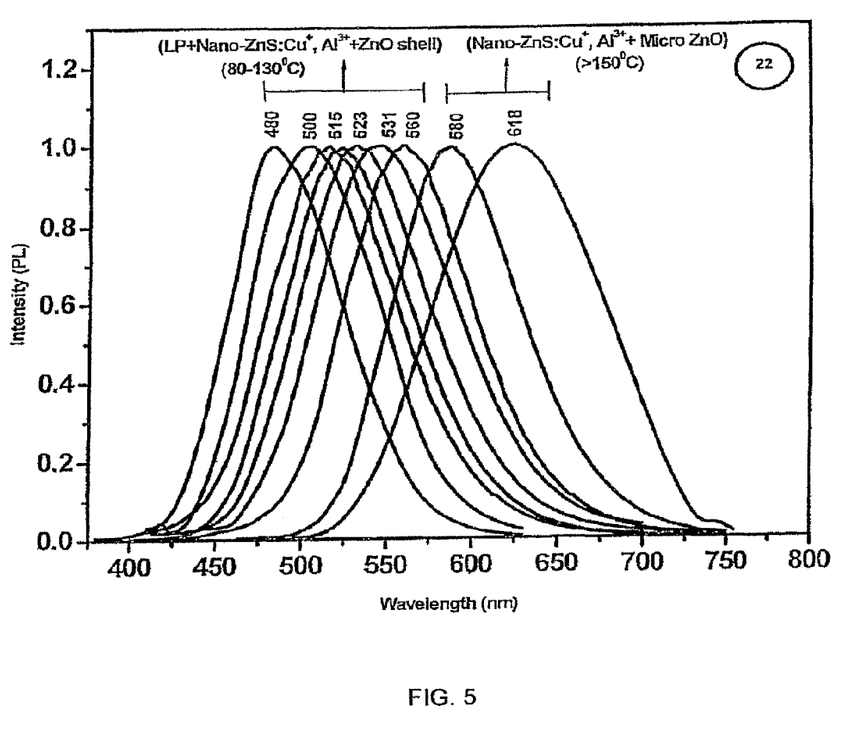
FIG. 5 shows: Photoluminescence emission spectra showing tunable emission color from doped ZnS nanocrystals generated in situ within the layered precursor.

A further advantage of the present invention is that, the emission color of the nanoparticles can be effectively tuned over a wide range from blue (~480 nm) to red (~618 nm) by a single step process of controlled decomposition of the initial precursor. The emission color is modified by way of changing the phase content of nano-ZnS/micro-ZnO shell. The compositional changes are evident from the XRD pattern in FIG. 3. With partial surface oxidation of ZnS nanoparticles or incorporation of oxygen in nano sized ZnS surface, and also the formation of oxygen-deficient $ZnO_{1-\delta}$ at the surface with $Cu^+$ and Al3+ at $Zn^{2+}$ site, leads to changes in the PL emission characteristics from green to yellow, orange or red. Oxygen vacancies ($V_o$) in ZnO act as donor centers and gives green PL emission whereas the interstitial oxygen gives rise to orange-red emission. The δ value in $ZnO_{1-\delta}$ decreases with the extent of oxidation (heat treatment) and accordingly, the concentration of oxygen vacancies decreases whereas the interstitial oxygen increases leading to red-shift in emission colors as seen in the photoluminescence spectra (FIG. 5). Thus the emission color is tuned by changing the nano-ZnS/micro-ZnO core/shell ratio at the interface.

Figure 6:
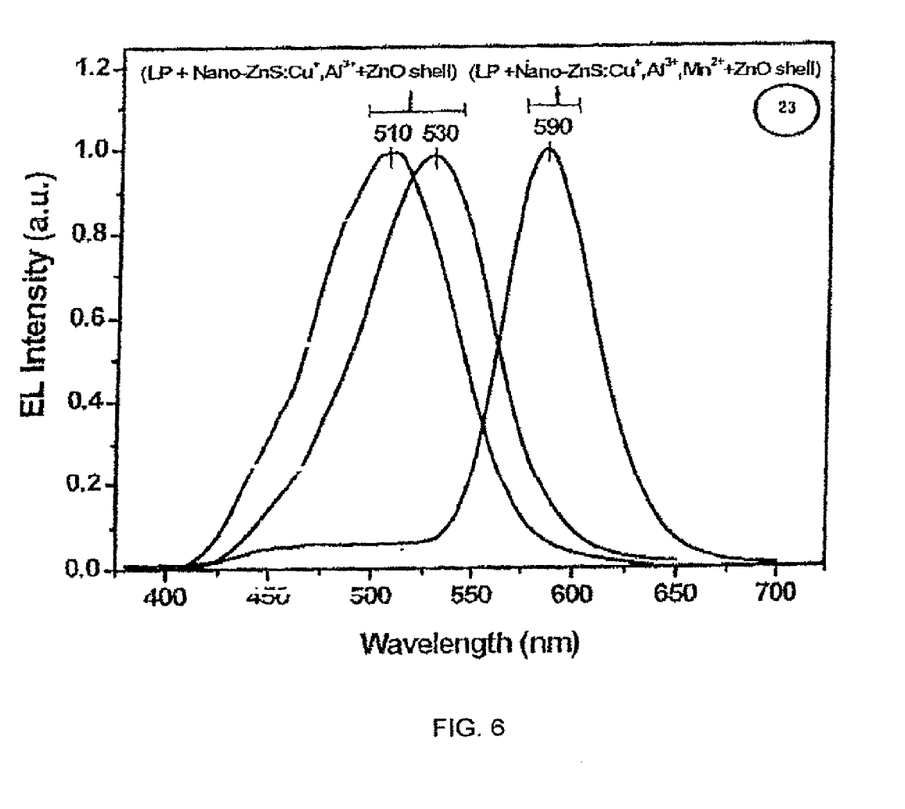
FIG. 6 shows: Electroluminescence spectra from doped ZnS nanocrystals generated in situ within the layered precursor.

Yet another important advantage of the present invention is that the decomposition of the layered precursor leads to a specific type of microstructure wherein the doped nanoparticles embedded have a lossy-dielectric behavior at ac electric-field. This facilitates efficient, low-voltage, ac electroluminescence (EL) from the doped ZnS nanocrystals. FIG. 6 refers to the EL emission spectra from ac-powder-EL (ACPEL) cells made by using two different kinds of doped nanoparticles systems (decomposed products) of the present invention. EL activity can be seen only in materials containing predominantly ZnS nanoparticles rather than ZnO particles, which is not EL active. Efficient blue-green and green-yellow EL emission can be obtained from Cu—Al doped nano ZnS+micro ZnO particles whereas the orange emission is obtained from ZnS:Cu+—Mn2+—Al3+, as described in example 4. Thus, the new, environment-friendly nanoparticles can be used for multi-color emitting EL displays, CRT displays, field emission displays, projection screens, etc.

Yet another advantage of the present invention is that the nanophosphors prepared by the present invention do not contain any toxic or carcinogenic elements, unlike the case of CdSe, CdS or ZnSe based luminophors. Therefore, these particles are safe for both in vitro as well as in vivo biological applications such as bio-labeling and medical imaging. Further, bio-molecules of pharmaceutical importance (drugs) can be intercalated into the gallery space of the layered structure and the composite may be used as a new drug-delivery system wherein the luminescence from the nanoparticles can be used to activate or monitor the drug delivery mechanism in biological tissues.

EXAMPLES

The present invention is illustrated with the help of the following examples, which are not intended to limit the scope of the invention and any modifications falls within the scope of this invention.

Example 1

Synthesis of Green Emitting Nanocrystals in Aqueous Medium

For the preparation of nanocrystals, 500 ml of IM zinc sulfate aqueous solution is mixed homogenously with 50 ml of 0.01M copper acetate (1 at % $Cu^{2+}$) solution and 10.0 mg of anhydrous Sodium Sulphite Powder. The mixture thus obtained is added with 100 ml of 0.01 M aluminum nitrate solution (2 at % $Al^{3+}$) and 500 ml of I M thiourea. In the next step $NH_4OH$ solution is added until the pH of the reaction mixture raises to 10-11, which is heated to 60-70° C. for a period of 20-30 minutes to obtain a white precipitate which is filtered and subsequently washed and dried at 50-60° C. for its storage. Alternatively, the precipitate is decomposed in the mother-liquor by increasing the temperature to 100-110° C. for a period of 15-17 minutes. Further, alternatively, Teflon-lined reactor (autoclave) may also be used for the heat treatment of the precipitate at a temperature of 100-110° C. The precipitate thus treated is subjected to filtration, washing followed by drying at 70-80° C. The nanocrystals thus obtained shows bright luminescence in green color, the yield of which is ~90%.

Example 2

Synthesis of Yellow Emitting Nanocrystals in Aqueous Medium

For the preparation of nanocrystals, 500 ml of IM zinc sulfate aqueous solution is mixed homogenously with 50 nil of 0.01 copper acetate (1 at % $Cu^{2+}$) solution and 10.0 mg of anhydrous Sodium Sulphate Powder. The mixture thus obtained is added with 100 ml of 0.01 M aluminum nitrate solution (2 at % $Al^{3+}$) and 500 ml of I M thiourea. In the next step $NH_4OH$ solution is added until the pH of the reaction mixture raises to 10-11, which is heated to 60-70° C. for a period of 20-30 minutes to obtain a white precipitate. This solid-precursor is either separated and stored for use or decomposed by increasing the temperature of reaction medium to 110-130° C. for a period of 15-17 minutes to obtain precipitate containing the doped nanocrystals Further, alternatively, Teflon-lined reactor (autoclave) may also be used for the heat treatment of the precipitate at a temperature of 110-130° C., which is filtered, washed and dried of 70-80° C. The nanocrystals thus obtained shows bright yellow luminescence in 570 nm showing effective doping, the yield of which is ~90%.

Example 3

Synthesis of Orange Emitting Nanocrystals in Aqueous Medium

For the preparation of nanocrystals, 500 ml of 1M zinc sulfate aqueous solution is mixed homogenously with 50 ml of 0.01M copper acetate (1 at % $Cu^{2+}$) solution, and 10.0 mg of anhydrous sodium sulphite powder. The mixture thus obtained is added with 100 ml of 0.01M aluminum nitrate solution (2 at % $Al^{3+}$), 50 ml of 0.001M manganese sulphite ($MnSO_4$ n $H_2O$) and 500 ml of 1M thiourea. In the next step, 5% solution of $NH_4OH$ or NaOH solution is added until the pH of the reaction mixture raises to ~9, which is heated to ~60-70° C. for a period of 20-30 minutes, under atmospheric pressure, to obtain a white precipitate which is decomposed in air or water at 130-140° C. to generate $Cu^+$—$Mn^{2+}$—$Al^{3+}$ doped ZnS nanoparticles covered with ZnO shell. The precipitate thus obtained is filtered, washed and dried at 70-80° C. The nanocrystals thus obtained shows bright orange luminescence at 590 nm, the yield of which is ~90% and the same is used for the fabrication of EL devices emitting orange emission as seen in FIG. 6.

It is to be understood that the process of the present invention is susceptible to modifications, adaptations, changes by those skilled in art. Such modifications, adaptations, changes are intended to be within the scope of the present invention, which is further set forth under the following claims:

The invention claimed is:

1. A single-source solid precursor matrix for semiconductor nanocrystals comprising of 45-55% by weight of zinc, 28-35% by weight of oxygen, 0.70-1.2% by weight of carbon, 1.5-2.5% by weight of hydrogen, 4-6% by weight of nitrogen, 5-7% by weight of sulphur and 1-5% by weight of dopant ions with respect to the weight of zinc atoms.

2. The single-source solid precursor matrix of claim 1, wherein the matrix comprises a mixture which is heated at a temperature of 60-70° C. for a period of 20-30 minutes.

3. Doped semiconductor nanocrystals for multicolor displays and bio markers comprising 60-65% by weight of zinc, 30-32% by weight of sulphur, 1.2-1.3% by weight of copper and 1.2-1.3% by weight of dopant ions.

4. The doped semiconductor nanocrystals of claim 3, wherein the nanocrystals comprise a compound which is heated at a temperature of 80-150° C. for a period of 20-30 minutes.

\* \* \* \* \*